(12) United States Patent
Raassina

(10) Patent No.: US 9,723,755 B2
(45) Date of Patent: Aug. 1, 2017

(54) DRIVE UNIT

(71) Applicant: KONE Corporation, Helsinki (FI)

(72) Inventor: Pasi Raassina, Numminen (FI)

(73) Assignee: KONE CORPORATION, Helsinki (FI)

( * ) Notice: Subject to any disclaimer, the term of this patent is extended or adjusted under 35 U.S.C. 154(b) by 48 days.

(21) Appl. No.: 14/865,860

(22) Filed: Sep. 25, 2015

(65) Prior Publication Data

US 2016/0120069 A1    Apr. 28, 2016

(30) Foreign Application Priority Data

Oct. 27, 2014  (FI) ..................................... 20145938

(51) Int. Cl.
*H05K 7/20*    (2006.01)
*H05K 1/18*    (2006.01)
(Continued)

(52) U.S. Cl.
CPC ....... *H05K 7/20509* (2013.01); *H05K 1/0203* (2013.01); *H05K 1/141* (2013.01); *H05K 1/181* (2013.01); *H05K 7/209* (2013.01); *H05K 7/20909* (2013.01); *H05K 13/00* (2013.01); *H05K 2201/10007* (2013.01)

(58) Field of Classification Search
CPC . H01L 2224/48227; H01L 2224/73265; H01L 2924/181; H01L 2924/14; H05K 1/141; H05K 3/0061; H05K 1/0204; H05K 2201/09054; H05K 1/0203; H05K 13/00; H05K 7/20409; H05K 9/0007; H05K 1/0215; H05K 7/20418; H05K 7/20436; H05K 9/0081; H05K 7/20509; H05K 1/181; H05K 7/209; H05K 7/20909; H05K 2201/10007

See application file for complete search history.

(56) References Cited

U.S. PATENT DOCUMENTS 5,537,074 A * 7/1996 Iversen ..................... G05F 1/70
                                                         257/712
6,047,874 A * 4/2000 Asai ....................... B65H 20/22
                                                         226/110

(Continued)

FOREIGN PATENT DOCUMENTS

CN    203377773 U    1/2014

*Primary Examiner* — Adam B Dravininkas
(74) *Attorney, Agent, or Firm* — Birch, Stewart, Kolasch & Birch, LLP

(57) ABSTRACT

A drive unit for driving a motor has a component assembly including a main circuit board having a component side and a solder side, one or more main circuit conductors formed in at least one layer of the main circuit board, a power component module including one or more power components, the power component module having electrical connection terminals for connecting the power component(s) to the one or more main circuit conductors of the main circuit board and a cooling plate coupled to the power component(s) in a manner enabling transfer of heat from the power component(s) to the cooling plate. The power component module is mounted to the component side of the main circuit board. The component assembly further includes a heat sink mounted on the cooling plate and a fan mounted on the heat sink.

20 Claims, 4 Drawing Sheets

(51) Int. Cl.
  *H05K 1/02*    (2006.01)
  *H05K 1/14*    (2006.01)
  H05K 13/00    (2006.01)

(56) References Cited

U.S. PATENT DOCUMENTS

| | | | |
|---|---|---|---|
| 6,477,053 B1* | 11/2002 | Zeidan | H05K 7/20127 |
| | | | 165/80.3 |
| 2001/0012212 A1 | 8/2001 | Ikeda | |
| 2003/0062149 A1* | 4/2003 | Goodson | F04B 19/006 |
| | | | 165/104.11 |
| 2004/0246662 A1* | 12/2004 | Thurk | H02M 1/44 |
| | | | 361/631 |
| 2005/0190539 A1* | 9/2005 | Watanabe | H05K 7/20854 |
| | | | 361/704 |
| 2006/0012986 A1* | 1/2006 | Mazzochette | F21K 9/00 |
| | | | 362/227 |
| 2006/0164811 A1* | 7/2006 | Maxwell | H05K 1/0203 |
| | | | 361/709 |
| 2010/0053898 A1* | 3/2010 | Isomoto | H05K 7/20918 |
| | | | 361/697 |
| 2010/0059880 A1* | 3/2010 | Baek | H01L 23/467 |
| | | | 257/713 |
| 2012/0168916 A1* | 7/2012 | Chi | H01L 21/6835 |
| | | | 257/659 |
| 2012/0201008 A1* | 8/2012 | Hershberger | H05K 1/0203 |
| | | | 361/720 |
| 2012/0250254 A1* | 10/2012 | Kojyo | H05K 7/20918 |
| | | | 361/692 |

* cited by examiner

DRIVE UNIT

FIELD OF THE INVENTION

The invention relates to drive units suitable for driving an elevator car or a conveyor.

BACKGROUND OF THE INVENTION

Elevators are used for lifting a load in a building. An elevator usually comprises an elevator car with which a load is transferred, as well as a counterweight. Elevator car and counterweight are adapted to move in opposite directions along vertical path in an elevator shaft.

The driving force for moving elevator car and counterweight is usually produced with a hoisting machine comprising an electric motor with a traction sheave coupled to the rotor of the electric motor. A hoisting roping runs via the traction sheave. The hoisting roping transmits the driving force produced by the electric motor to the elevator car and to the counterweight such that elevator car is moved in a controlled manner.

Conveyors, such as escalators and moving walkways, are used for transferring people by means of steps/pallets arranged to an endless track. A driving machine including an electric motor is usually arranged to drive the endless track by means of a sprocket or corresponding.

Supply of the electric power to the electric motor most generally occurs e.g. with a drive unit such as a frequency converter comprising power components as igbt transistors, mosfet transistors, bipolar transistors or other suitable controllable solid state switches.

In modern elevator systems without machine room, the hoisting machine and the drive unit are disposed in the elevator shaft such that a separate machine room is not needed. This type of solution saves building space. Space-saving is anyway a growing trend both in fabricating new elevators and in modernizing old elevators, in which case a new elevator system must be fitted into the existing old elevator shaft. Fitting a new elevator system into the existing old elevator shaft can be challenging owing to, inter alia, the small spaces available in the elevator shaft.

Space-saving is also a trend in conveyor systems, in which case aim is to utilize building space as efficiently as possible.

Taking the preceding into account, there is a need for improvement as regards to space-savings and space-efficiency.

AIM OF THE INVENTION

It is the objective of this invention to disclose a low-profile drive unit which can be mounted into a narrow space available in an elevator shaft or in a conveyor installation. Therefore the invention discloses a drive unit according to claim 1. Some preferred embodiments of the invention are described in the dependent claims. Some inventive embodiments, as well as inventive combinations of various embodiments are also presented in the specification and in the drawings of the present application.

SUMMARY OF THE INVENTION

An aspect of the invention is a drive unit for driving a motor, in particular an elevator motor or a conveyor motor. The drive unit has a component assembly comprising a main circuit board having a component side and a solder side, one or more main circuit conductors formed in at least one layer of the main circuit board, a power component module including one or more power components, the power component module having electrical connection terminals for connecting the power components to the one or more main circuit conductors of the main circuit board and a cooling plate coupled to the power components in a manner enabling transfer of heat from the power components to the cooling plate. The power component module is mounted to the component side of the main circuit board. The component assembly also comprises a heat sink mounted on the cooling plate and a fan mounted on the heat sink, the rotating axis of the fan aligned in a direction perpendicular to the plane of the main circuit board.

This means that the components of the drive unit are assembled in a manner leading to a low-profile drive unit design. The disclosed component assembly is modular, that is, it is easy to replace and additional components assemblies may be included to increase functionality, without increasing height of the drive unit. This makes the drive unit especially suitable for elevator systems without machine rooms, because it can be mounted to a narrow space in an elevator shaft outside path of movement of elevator car and counterweight (e.g. to elevator shaft wall). On the other hand, the drive unit is also well suited for conveyors such as escalators or moving walkways, in which case the drive unit can be mounted to a narrow space under escalator/conveyor track or into a small machinery space, for example.

According to an embodiment, the heat sink is a pin fin heat sink.

According to an embodiment, the power component module is a low-profile module and the heat sink is a low-profile heat sink and the fan is a low-profile fan. The power component module, the heat sink and the fan are successively sandwiched on the main circuit board. The term "low-profile" means that a low-profile component has width greater than its height, thereby facilitating sandwiching of the low-profile components.

According to an embodiment, the power component module has the electrical connection terminals at its upper side. The electrical connection terminals are connected directly to the main circuit board such that the upper side of the power component module faces the component side of the main circuit board.

According to an embodiment, the power component module has the cooling plate at its bottom side.

According to an embodiment, the component assembly comprises connecting terminals for connecting the main circuit board to the DC link of the drive unit.

According to an embodiment, the drive unit has a second component assembly comprising a main circuit board having one or more main circuit conductors formed in at least one layer of the main circuit board as well as a low-profile power component module, a low-profile heat sink and a low-profile fan successively sandwiched on the main circuit board. The second component assembly comprises DC link terminals for connecting the main circuit board to the DC link of the drive unit.

According to an embodiment, the component assembly comprises an insulation cover mounted on the components of said component assembly.

According to an embodiment, the component assembly comprises a grounding plate mounted on bottom of the insulation cover, the grounding plate being electrically connected to the heat sink and/or the cooling plate of the power component module.

According to an embodiment, the drive unit comprises a DC link board including a positive DC link rail a negative DC link rail. The drive unit comprises at least one DC link capacitor connected between the positive DC link rail and the negative DC link rail, the at least one DC link capacitor being mounted to the component side of said DC link board. The DC link board comprises DC link terminals for connecting the DC link board to the DC link of the drive unit.

According to an embodiment, the planes of the main circuit board(s) and the DC link board are coplanar. This means that the separate component assemblies may be placed adjacent to each other such that they are coplanar. Therefore additional components assemblies may be included to increase functionality, without increasing height of the drive unit.

According to an embodiment, the DC link rails of the main circuit boards of the component assemblies are connected to the DC link rails of the DC link board via DC link busbars. According to an embodiment, the DC link busbars are mounted to the DC link rails of DC link board and the DC link rails of the main circuit boards of the component assemblies by means of the DC link terminals.

According to an embodiment, the drive unit has a case comprising cover, sidewalls and bottom, and in that the main circuit board is fitted inside the case and fixed to the bottom such that solder side of the main circuit board is towards the bottom.

According to an embodiment, the bottom of the case is made of electrically conducting material, and the grounding plate is electrically connected to the bottom. Therefore the cooling plate of the power component module as well as the heat sink are grounded to the bottom via the grounding plate, which reduces EMC disturbance of the drive unit.

According to an embodiment, the heat sink has a first area and a second area surrounded by the first area. The first area has cooling fins of given height and the second area has cooling fins with lower height than the first area or cooling fins missing. The fan is mounted on the second area such that the cooling fins of the first area extend to the side of the fan.

According to an embodiment, the power component module includes power components of an inverter configuration.

According to an embodiment, the power component module includes power components of a rectifier configuration.

The preceding summary, as well as the additional features and additional advantages of the invention presented below, will be better understood by the aid of the following description of some embodiments, said description not limiting the scope of application of the invention.

BRIEF EXPLANATION OF THE FIGURES

FIG. 2b is an exploded view view of back side of the component assembly of FIG. 2a.

MORE DETAILED DESCRIPTION OF PREFERRED EMBODIMENTS OF THE INVENTION

For the sake of intelligibility, in FIGS. 1-4 only those features are represented which are deemed necessary for understanding the invention. Therefore, for instance, certain components/functions which are widely known to be present in corresponding art may not be represented.

In the description same references are always used for same items.

Figure 1:
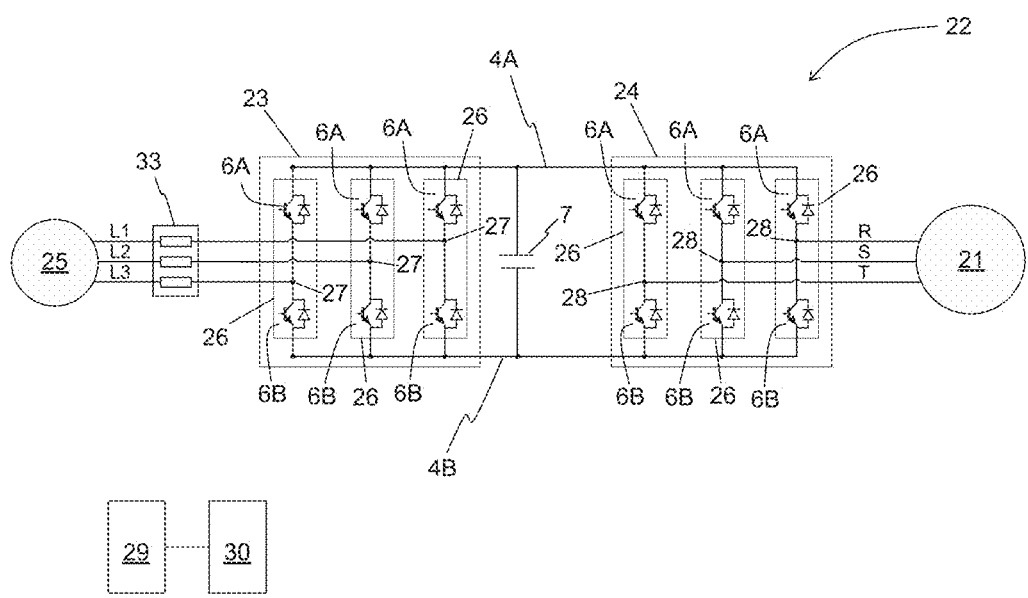
FIG. 1 depicts components of an elevator in an exemplary embodiment.

FIG. 1 depicts components of an elevator in an exemplary embodiment. The elevator of FIG. 1 comprises an elevator car for transferring passengers/cargo as well as a counterweight. In a driving situation, elevator car and counterweight move in opposite directions along vertical path in an elevator shaft.

The driving force for moving elevator car and counterweight is produced with a hoisting machine comprising a permanent magnet electric motor 21 with a traction sheave coupled to the rotor of the electric motor 21. A hoisting roping runs via the traction sheave. The hoisting roping transmits the driving force produced by the electric motor 21 to the elevator car and to the counterweight such that elevator car is moved in a controlled manner. Instead of permanent magnet electric motor also other types of electric motors, such as an induction motor or a reluctance motor, could be used.

The speed of the elevator car is adjusted to be according to the target value for the speed of the elevator car, calculated by the elevator control unit 29. The target value for the speed of the elevator car is formed in such a way that the elevator car can transfer passengers from one floor to another on the basis of elevator calls given by elevator passengers when the target value is followed.

Supply of the electric power to the electric motor 21 occurs with a frequency converter 22. Frequency converter 22 has a main circuit, which distributes electric power between electric motor 21 and mains 25. Main circuit comprises a regenerative line bridge 23 and an inverter 24. Regenerative line bridge 23 and inverter 24 are interconnected via a DC link. DC link has a positive DC link rail 4A and a negative DC link rail and a DC link capacitor 7 connected between positive DC link rail 4A and negative DC link rail 4B. When elevator car moves in heavy direction, force acts on traction sheave in the moving direction of the elevator car. In that case frequency converter 22 supplies electric power from mains 25 to the electric motor 21. When elevator car moves in light direction, force acts on traction sheave in a direction opposite to the moving direction of elevator car. In that case electric motor 21 brakes movement of elevator car and generates electric power, which is supplied back to the mains 25 with the frequency converter 22.

Both line bridge 23 and inverter 24 have power components, namely igbt transistors 6A, 6B arranged as legs 26. Instead of igbt transistors or in addition to igb transistors also mosfet transistors, bipolar transistors, silicon carbide (SiC) power transistors, gallium nitride (GaN) power transistors or other suitable controllable solid state switches could be used. Each leg 26 has a high-side igbt transistor 6A connected to positive DC link rail 4A and low-side igbt transistor 6B connected to negative DC link rail 4B. The high-side and low-side transistors 6A, 6B of the same leg 26 are also connected together to form an AC terminal 27. AC terminal 27 of each leg 26 of the line bridge 23 is connected to one of the AC power lines L1, L2, L3 of the mains 25. Correspondingly, AC terminal 28 of each leg 26 of the inverter 24 is connected to one of the stator winding cables R, S, T of the permanent magnet electric motor 21. The igbt transistors 6A, 6B of both line bridge 23 and inverter 24 are controlled with pulse width modulator 30. High-side 6A and low-side 6B transistors of each leg 26 are switched alternatively to positive DC link rail 4A and negative DC link rail 4B such that voltage of the AC terminal 27, 28 alternates between positive DC link rail voltage and negative DC link rail voltage according to the modulation. With igbt transistors, preferably a switching frequency between 3 kHz and 20 kHz is used.

Antiparallel-connected free-wheeling diodes are associated with the igbt transistors 6A, 6B. The purpose of the free-wheeling diodes is to provide a route for inductive current in case that none of the igbt transistors 6A, 6B is conducting.

An additional line current filter 33 is further connected between AC power lines L1, L2, L3 and line bridge 23 to remove the current ripple, which is a result of modulation of the line bridge 23 igbt transistors 6A, 6B.

The hoisting machine and the frequency converter 22 are disposed inside the elevator shaft such that a separate machine room is not needed. To be precise, the hoisting machine and the frequency converter 22 are mounted to a narrow space between elevator shaft wall and path of movement of elevator car. In an embodiment, the hoisting machine is fixed to a guide rail of elevator car, such that it is located in a space between guide rail and shaft wall. The frequency converter 22 is preferably located near the hoisting machine to minimize cabling. In an embodiment, the frequency converter 22 is fixed to the guide rail of elevator car. In an alternative embodiment, the frequency converter is fixed to the shaft wall.

To fit the frequency converter 22 to the narrow space between elevator shaft wall and path of movement of elevator car, the frequency converter is designed as a low-profile unit such that height of the unit is designed as small as possible. The low-profile unit design has been achieved, inter alia, with the component assembly of FIGS. 2a and 2b.

Figure 2A:
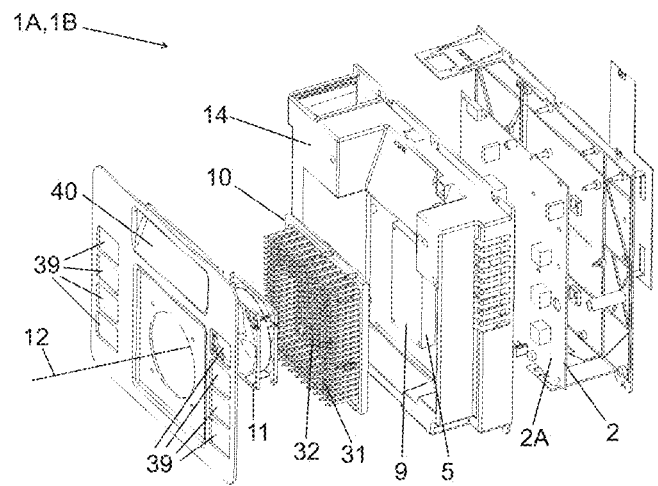
FIG. 2a is an exploded view of front side of a component assembly of the drive unit according to an exemplary embodiment.
Figure 2B:
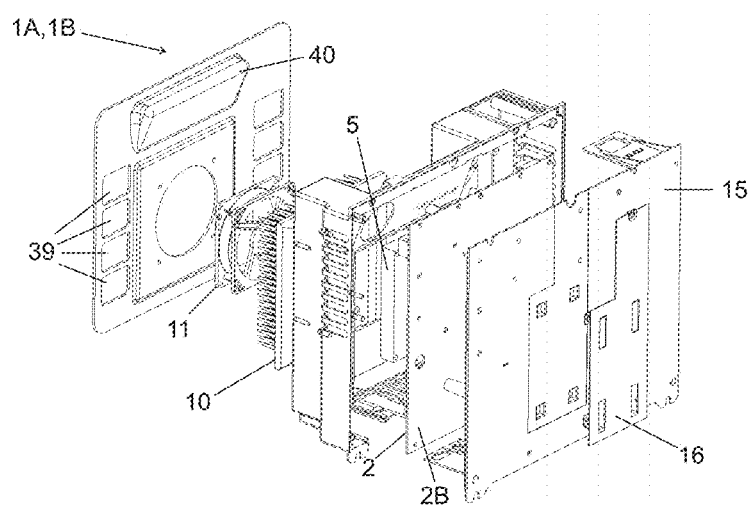

FIG. 2a is an exploded view of front side of a component assembly 1A, 1B of the frequency converter 22 according to an exemplary embodiment. FIG. 2b is an exploded view of back side of the component assembly 1A, 1B of FIG. 2a. The component assembly 1A, 1B comprises a main circuit board 2, which is a printed circuit board having a component side 2A and a solder side 2B. The well-established terms "component side 2A" and "solder side 2B" refer to the art of electronic device manufacturing, wherein "component side" is the primary installation side of electronic components, such as through-hole electronic components on a printed circuit board and "solder side" is the side processed during soldering (such as wave soldering, for example). Main circuit board 2 has main circuit conductors formed in at least one layer of the main circuit board. The main circuit conductors formed in at least one layer of the main circuit board may include (see FIG. 1) positive DC link rail 4A, negative DC link rail 4B, as well as the output terminals 27, 28 of the corresponding phase legs 26. In an embodiment, the main circuit conductors are formed on the solder side 2B of the main circuit board 2. Alternatively or additionally, one or more main circuit conductors may be formed in a layer inside the main circuit board 2. Alternatively or additionally, one or more main circuit conductors may be formed on the component side of the main circuit board 2.

The component assembly 1A, 1B comprises a low-profile power component module 5. The power component module 5 includes igbt transistors 6A, 6B with antiparallel-connected free-wheeling diodes of line bridge 23 and/or inverter 24. In contrast to prior art solutions, the power component module 5 is mounted to the component side 2A of the main circuit board 2. The power component module 5 has electrical main circuit connection terminals 8 at its upper side.

The igbt transistors 6A, 6B/free-wheeling diodes of the power component module 5 are connected to the main circuit conductors 4A, 4B, 27, 28 of the main circuit board 2 via the connection terminals 8. The power component module 5 is installed to the component side 2A of the main circuit board directly via the main circuit connection terminals 8 such that that the upper side of the power output stage module 5 faces the component side 2A of the main circuit board 2.

The power component module 5 has a cooling plate 9 at its bottom side. The cooling plate 9 is coupled to the igbt transistors 6A, 6B/free-wheeling diodes of the power component module 5 in a manner enabling transfer of heat from the the igbt transistors 6A, 6B/free-wheeling diodes to the cooling plate 9. In an embodiment, a thin ceramic substrate is fitted to the power component module 5 between igbt transistors 6A, 6B/free-wheeling diodes and cooling plate 9 to transfer heat from igbt transistors 6A, 6B/free-wheeling diodes to cooling plate 9 as well as to electrically isolate igbt transistors 6A, 6B/free-wheeling diodes from cooling plate 9. Instead of ceramic substrate, also other materials with suitable combination of heat conducting/electrical isolation properties may be used.

A low-profile pin fin heat sink is 10 mounted on the cooling plate 9 to conduct heat away from the cooling plate 9. The heat sink 10 has a first area 31 and a second area 32. The first area 31 surrounds the second area 32. The first area 31 has cooling fins of given height of several centimeters and the second area 32 has cooling fins with considerably lower height, e.g. height of less than a centimeter.

A fan 11 is mounted on the second area 32 of the heat sink 10 such that the cooling fins in the first area 31 of the heat sink 10 extend to the side of the fan 11. The rotating axis 12 of the fan 11 is aligned in a direction perpendicular to the plane of the main circuit board 2 to reach a low-profile fan arrangement. In one embodiment the fan 11 is an axial fan blowing cooling air towards the second area 32 of the heat sink 10. In this case the cooling air turns and circulates to within the cooling fins of the first area 31, therefore transferrin heat from cooling fins of the first area 31 to the ambient. Alternatively, the fan 11 may be a radial fan fitted adjacent to the heat sink 10 such that it can blow air directly to within the cooling fins of the first area 31. This means that an efficient fan operation can be achieved, because power of fan is not wasted for turning the air flow. In this case no second area 32 is needed and all cooling fins can be of same height of several centimeters.

Even though not represented in FIGS. 1a, 1b, the component assembly may comprise additional components as igbt gate drivers, logic circuitry, microcontrollers and/or digital signal processors for controlling the igb transistors 6A, 6B or snubber circuit for reducing switching transients of the igbt transistors. The additional components may be installed to the main circuit board 2 and/or to a separate control board. Further, the power component module 5 may have additional signal terminals connected to the main circuit board 2/the separate control board such that the control signals of the igbt transistors 6A, 6B are transferred from the main circuit board 2/the control board to the control gates of the igbt transistors 6A, 6B via the signal terminals.

The component assembly 1A, 1B further comprises a plastic insulation cover 14 mounted on the components 2, 5, 10, 11 of said component assembly 1A, 1B. The purpose of the insulation cover 14 is to protect against electrostatic discharge and electric shock, as well as to protect the component assembly during storage, transportation and elevator installation and maintenance. The main circuit board 2 is fixed to the insulation cover 14 such that solder side 2B of the main circuit 2 board is towards bottom 15 of the insulation cover 14.

The insulation cover 14 has holes 39 for cooling air to exit from heat sink 10 to the ambient. Further, the insulation cover 14 has also air guide 40 which directs cooling air to selected components of the frequency converter 22.

The component assembly 1A, 1B comprises a grounding plate 16 mounted on plastic bottom 15 of the insulation cover 14. The grounding plate 16 is electrically connected to the cooling plate 9 of the power component module 5 and to the heat sink 10.

In view of the above, the power component module 5, the heat sink 10 and the fan 11 are therefore successively sandwiched on the main circuit board 2 to reach a low-profile component assembly, which it is easy to replace and modular, e.g. additional components assemblies may be included to increase functionality, without increasing height of the frequency converter.

Figure 3:
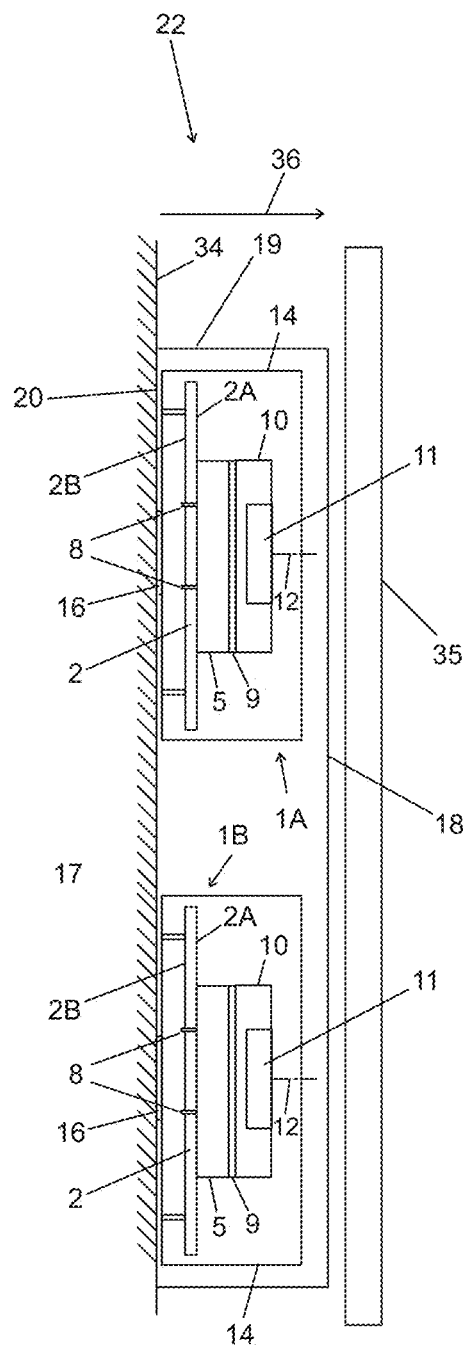
FIG. 3 is a schematic of a drive unit of an elevator system according to an exemplary embodiment.
Figure 4:
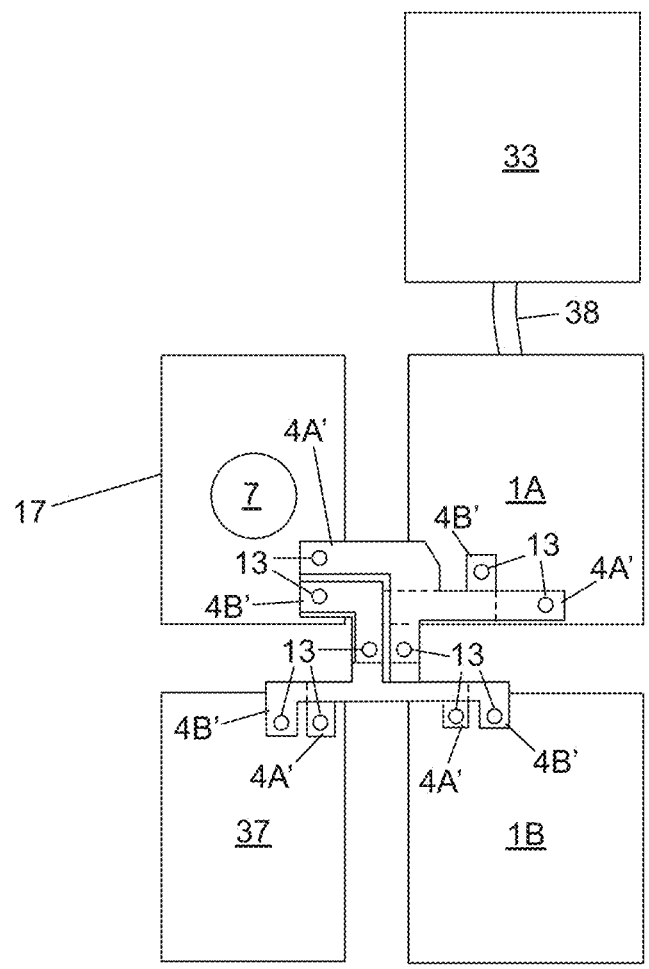
FIG. 4 depicts DC link architecture of a drive unit in an exemplary embodiment.

Configuration of frequency converter 22 having component assemblies 1A, 1B according to the above disclosure is depicted in FIGS. 3 and 4. FIG. 3 is a schematic side view of frequency converter 33 of an elevator system according to an exemplary embodiment. FIG. 4 depicts from above DC link architecture of a drive unit in an exemplary embodiment. 6. The frequency converter 22 has two components assemblies 1A, 1B according to the above disclosure. The first component assembly 1A has the power module including igbt transistors 6A, 6B and freewheeling diodes of the line bridge 23. The line current filter 33 is connected to the line bridge 23 with supply cables 38. The second component assembly 1B has the power module 5 including igbt transistors 6A, 6B and freewheeling diodes of the inverter 24. Both component assemblies 1A, 1B comprise DC link connecting terminals 13 for connecting the main circuit board 2 of the corresponding component assembly 1A, 1B to the common DC link 4A, 4B of the frequency converter 22.

The frequency converter comprises a DC/DC buck power supply 37 which is operable to output a 24V DC voltage, used as a supply voltage of control electronics. High-voltage input of DC/DC power supply 37 is connected directly to positive 4A and negative 4B DC link rails of the DC link main circuit, that is, to a DC voltage of several hundreds of volts.

The frequency converter 22 further comprises a DC link board 17, e.g. a printed circuit board having a positive DC link rail 4A and a negative DC link rail 4B formed in at least one layer of the printed circuit board. A DC link capacitor 7 or a stack of DC link capacitors, in the form of electrolytic capacitors, aluminium capacitors, ceramic capacitors, plastic capacitors or corresponding is connected between the positive DC link rail 4A and the negative DC link rail 4B, mounted to the component side of the DC link board 17. The purpose of the DC link capacitor(s) 7 is to store electric energy to even out voltage variations in DC link 4A, 4B. The DC link board 17 has similar DC link connecting terminals 13 as the component assemblies 1A, 1B.

DC link rails 4A, 4B of main circuit boards 2 of component assemblies 1A, 1B are connected to DC link rails 4A, 4B of DC link board 17 via DC link busbars 4A', 4B'. DC link busbar 4A' connects together positive DC link rails 4A and DC link busbar 4B' connects together negative DC link rails 4B. In FIG. 4 DC link busbars 4A', 4B' partly overlap each other. DC link busbars 4A', 4B' are made of copper and covered with plastic insulator laminated onto them. DC link busbars 4A', 4B' are coupled to DC link rails 4A, 4B of DC link board 17 and main circuit boards 2 with screw terminals 13.

In one embodiment, the DC link board 17 with the DC link capacitor(s) 7 is included in component assembly 1A such that it is fitted inside the same plastic insulation cover 14 as other components of component assembly 1A. This means that DC link board 17/DC link capacitor(s) 7 is part of line bridge 23 module, which can be handled as a one spare part unit, e.g. DC link board 17/DC link capacitor(s) 7 is replaced at the same time as line bridge 23 components.

As can be seen from FIG. 3, the planes of the main circuit boards 2 of the component assemblies 1A, 1B as well as the plane of the DC link board 17 are all coplanar with each other. This is possible because all the space-demanding components are installed to the component side, thereby enabling a low-profile frequency converter unit. Further, straight DC link busbars 4A', 4B' can be used, which simplifies the structure.

The frequency converter 22 has a case made of sheet metal. The case comprises cover 18, sidewalls 19 and bottom 20. The DC link board 17 is fixed to the bottom 20. Also each component assembly 1A, 1B is fixed to the bottom 20 via the grounding plate 16 such that cooling plate 9 and heat sink 11 of each component assembly 1A, 1B is electrically grounded to metallic bottom 20 of the case.

In the embodiment of FIG. 3, the low-profile frequency converter 22 is mounted to a space between elevator shaft wall 34 and guide rail 35. The height 36 of the frequency converter 22 is designed as low as possible. The bottom 20 of the frequency converter 22 if fixed to the shaft wall 34, near the hoisting machine such that only short power supply cables are needed between frequency converter 22 and electric motor 21 of the hoisting machine.

It is obvious to a skilled person that even more than two separate component assemblies 1A, 1B may be added to the frequency converter 22 for enhancing functionality. For example, a brake control assembly for controlling an electromagnetic brake of the hoisting machine may in included in the frequency converter 22.

It is also obvious to a skilled person that, instead of line bridge 23, the component assembly 1A may include different AC/DC rectifier configuration, such as a full-bridge diode rectifier. This kind of rectifier is operable to rectify AC voltage but not to regenerate power back to the mains 25. Additionally or alternatively, component assembly 1A, 1B of the rectifier may have PFC (power factor correction) configuration. The component assembly IA may be configured as a 3 phase rectifier or a 1 phase rectifier, for example.

It is obvious to a skilled person that the above-disclosed frequency converter 22 may be used as a space-efficient solution for driving motor of a conveyor, in particular motor of an escalator or moving walkway.

The invention is described above by the aid of a few examples of its embodiment. It is obvious to the person skilled in the art that the invention is not only limited to the embodiments described above, but that many other applications are possible within the scope of the inventive concept defined by the claims.

The invention claimed is:

1. A drive unit for driving a motor, the drive unit having a component assembly comprising:
    a main circuit board having a component side and a solder side;
    one or more main circuit conductors formed in at least one layer of the main circuit board;

a power component module including one or more power components, the power component module having electrical connection terminals for connecting the power component(s) to the one or more main circuit conductors of the main circuit board and a cooling plate coupled to the power component(s) in a manner enabling transfer of heat from the power component(s) to the cooling plate;

a heat sink mounted on the cooling plate; and a fan mounted on the heat sink, wherein the power component module is mounted to the component side of the main circuit board, wherein the power component module has the electrical connection terminals at an upper side thereof, which electrical connection terminals are connected directly to the main circuit board such that the upper side of the power component module faces the component side of the main circuit board, wherein the component assembly comprises an insulation cover mounted on the components of said component assembly, and wherein the component assembly comprises a grounding plate mounted on bottom of the insulation cover, the grounding plate being connected to the heat sink and the cooling plate of the power component module.

2. The drive unit according to claim 1, wherein the rotating axis of the fan is aligned in a direction perpendicular to the plane of the main circuit board.

3. The drive unit according to claim 1, wherein the heat sink is a pin fin heat sink.

4. The drive unit according to claim 1, wherein the power component module is a low-profile module and the heat sink is a low-profile heat sink and the fan is a low-profile fan, and wherein the power component module, the heat sink and the fan are successively sandwiched on the main circuit board.

5. The drive unit according to claim 1, wherein the component assembly comprises DC link terminals for connecting the main circuit board to a DC link of the drive unit.

6. The drive unit according to claim 1, further comprising a second component assembly comprising:

a main circuit board having one or more main circuit conductors formed in at least one layer of the main circuit board; and a low-profile power component module, a low-profile heat sink and a low-profile fan successively sandwiched on the main circuit board, wherein the second component assembly comprises connecting terminals for connecting the main circuit board to a DC link of the drive unit.

7. The drive unit according to claim 1, further comprising:

a DC link board having a positive DC link rail and a negative DC link rail; and at least one DC link capacitor connected between the positive DC link rail and the negative DC link rail, the at least one DC link capacitor being mounted to the component side of said DC link board.

8. The drive unit according to claim 7, wherein the plane of the main circuit board and the DC link board is coplanar.

9. The drive unit according to claim 1, wherein the drive unit has a case comprising cover, sidewalls and bottom, and wherein the main circuit board is fitted inside the case and fixed to the bottom such that solder side of the main circuit board is towards the bottom.

10. The drive unit according to claim 1, wherein the bottom is made of electrically conducting material, and wherein the grounding plate is electrically connected to the bottom.

11. The drive unit according to claim 1, wherein the heat sink has a first area and a second area surrounded by the first area, the first area having cooling fins of given height and the second area having cooling fins with lower height than the first area or cooling fins missing, wherein the fan is mounted on the second area.

12. The drive unit according to claim 2, wherein the heat sink is a pin fin heat sink.

13. The drive unit according to claim 2, wherein the power component module is a low-profile module and the heat sink is a low-profile heat sink and the fan is a low-profile fan, and wherein the power component module, the heat sink and the fan are successively sandwiched on the main circuit board.

14. The drive unit according to claim 3, wherein the power component module is a low-profile module and the heat sink is a low-profile heat sink and the fan is a low-profile fan, and wherein the power component module, the heat sink and the fan are successively sandwiched on the main circuit board.

15. The drive unit according to claim 2, wherein the component assembly comprises DC link terminals for connecting the main circuit board to a DC link of the drive unit.

16. The drive unit according to claim 3, wherein the component assembly comprises DC link terminals for connecting the main circuit board a DC link of the drive unit.

17. The drive unit according to claim 4, wherein the component assembly comprises DC link terminals for connecting the main circuit board to a DC link of the drive unit.

18. The drive unit according to claim 2, further comprising a second component assembly comprising:

a main circuit board having one or more main circuit conductors formed in at least one layer of the main circuit board; and a low-profile power component module, a low-profile heat sink and a low-profile fan successively sandwiched on the main circuit board, wherein the second component assembly comprises connecting terminals for connecting the main circuit board to a DC link of the drive unit.

19. The drive unit according to claim 3, further comprising a second component assembly comprising:

a main circuit board having one or more main circuit conductors formed in at least one layer of the main circuit board; and a low-profile power component module, a low-profile heat sink and a low-profile fan successively sandwiched on the main circuit board, wherein the second component assembly comprises connecting terminals for connecting the main circuit board to a DC link of the drive unit.

20. The drive unit according to claim 4, further comprising a second component assembly comprising:

a main circuit board having one or more main circuit conductors formed in at least one layer of the main circuit board; and a low-profile power component module, a low-profile heat sink and a low-profile fan successively sandwiched on the main circuit board, wherein the second component assembly comprises connecting terminals for connecting the main circuit board to a DC link of the drive unit.

* * * * *